(12) United States Patent
Johnston et al.

(10) Patent No.: US 8,596,825 B2
(45) Date of Patent: Dec. 3, 2013

(54) SOLID STATE LIGHT WITH OPTICAL GUIDE AND INTEGRATED THERMAL GUIDE

(75) Inventors: Raymond P. Johnston, Lake Elmo, MN (US); Michael A. Meis, Stillwater, MN (US); Martin Kristoffersen, Maplewood, MN (US); Brian W. Lueck, Houlton, WI (US); Katie B. Thompson, Saint Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 464 days.

(21) Appl. No.: 12/535,203

(22) Filed: Aug. 4, 2009

(65) Prior Publication Data

US 2011/0032708 A1 Feb. 10, 2011

(51) Int. Cl.
*F21V 29/00* (2006.01)

(52) U.S. Cl.
USPC ........ 362/294; 362/296.05; 362/273; 65/385; 65/386

(58) Field of Classification Search
USPC ........ 362/294, 373, 551, 552, 555, 580, 547, 362/218, 264, 345; 65/385, 386
See application file for complete search history.

(56) References Cited

U.S. PATENT DOCUMENTS

| | | | |
|---|---|---|---|
| 6,297,906 B1 * | 10/2001 | Allen et al. | 359/489.12 |
| 6,350,041 B1 * | 2/2002 | Tarsa et al. | 362/231 |
| 6,523,978 B1 * | 2/2003 | Huang | 362/249.04 |
| 6,802,363 B1 | 10/2004 | Wang | |
| 7,144,135 B2 * | 12/2006 | Martin et al. | 362/294 |
| 7,160,012 B2 | 1/2007 | Hilscher et al. | |
| 7,270,460 B2 | 9/2007 | Merz et al. | |
| 7,347,584 B2 | 3/2008 | Sun et al. | |
| 7,607,802 B2 * | 10/2009 | Kang et al. | 362/294 |
| D627,085 S | 11/2010 | Duan et al. | |
| D627,491 S | 11/2010 | Wang et al. | |
| D629,929 S | 12/2010 | Chen et al. | |
| D633,226 S | 2/2011 | Katsaros | |
| D634,451 S | 3/2011 | de Visser | |
| D642,704 S | 8/2011 | Hagens et al. | |
| 2004/0037087 A1 | 2/2004 | Desai | |
| 2004/0201990 A1 * | 10/2004 | Meyer | 362/255 |
| 2005/0117332 A1 | 6/2005 | Maack | |

(Continued)

FOREIGN PATENT DOCUMENTS

AU 2005100101 3/2005
CN 200968565 10/2007

(Continued)

OTHER PUBLICATIONS

U.S. Appl. No. 12/829,611, filed Jul. 2, 2010, "Transistor Ladder Network for Driving a Light Emitting Diode Series String".

(Continued)

*Primary Examiner* — Evan Dzierzynski
*Assistant Examiner* — Danielle Allen (57) ABSTRACT

A solid state light having a solid state light source such as LEDs, and optical guide, and a thermal guide. The optical guide is coupled to the light source for receiving and distributing light from the light source, and the thermal guide is integrated with the optical guide for providing thermal conduction from the solid state light source and dissipating heat through convection for cooling the light.

28 Claims, 8 Drawing Sheets

(56) References Cited

U.S. PATENT DOCUMENTS

| | | |
|---|---|---|
| 2005/0173719 A1 | 8/2005 | Yonekubo et al. |
| 2005/0195600 A1* | 9/2005 | Porchia et al. ............... 362/240 |
| 2005/0200262 A1 | 9/2005 | Wu |
| 2006/0274529 A1 | 12/2006 | Cao |
| 2006/0285325 A1 | 12/2006 | Ducharme et al. |
| 2007/0070645 A1 | 3/2007 | Coushaine et al. |
| 2007/0263393 A1 | 11/2007 | Van De Ven |
| 2008/0013316 A1* | 1/2008 | Chiang ...................... 362/264 |
| 2008/0049399 A1 | 2/2008 | Lu et al. |
| 2008/0084692 A1 | 4/2008 | DeRose |
| 2008/0084700 A1* | 4/2008 | Van De Ven ............... 362/373 |
| 2008/0186704 A1* | 8/2008 | Chou et al. ................. 362/249 |
| 2008/0210953 A1 | 9/2008 | Ladstatter et al. |
| 2009/0034250 A1 | 2/2009 | Chen |
| 2009/0034283 A1 | 2/2009 | Albright et al. |
| 2010/0148652 A1 | 6/2010 | Vetrovec |
| 2010/0181888 A1 | 7/2010 | Lu |
| 2010/0246166 A1 | 9/2010 | Hsu et al. |
| 2010/0264800 A1 | 10/2010 | Liu et al. |
| 2011/0309735 A1 | 12/2011 | Parker et al. |

FOREIGN PATENT DOCUMENTS

| | | |
|---|---|---|
| CN | 201003702 | 1/2008 |
| CN | 201081146 | 7/2008 |
| CN | 10-1852356 | 10/2010 |
| DE | 20 2004 012513 | 12/2004 |
| DE | 20 2007 009 272 | 12/2007 |
| GB | 2 345 954 | 7/2000 |
| JP | 2007-265892 | 10/2007 |
| JP | 2008-091140 | 4/2008 |
| TW | D119782 | 3/1995 |
| TW | D134004 | 9/1997 |
| TW | D137672 | 11/2010 |
| WO | WO 2006/006473 | 1/2006 |
| WO | WO 2007/130359 A2 | 11/2007 |
| WO | WO 2010/058325 | 5/2010 |
| WO | WO 2010/146746 | 12/2010 |

OTHER PUBLICATIONS

U.S. Appl. No. 12/960,642, filed Dec. 6, 2010, "Solid State Light With Optical Guide and Integrated Thermal Guide".

U.S. Appl. No. 29/380,445, filed Dec. 6, 2010 "Design Application for a Solid State Light Assembly".

U.S. Appl. No. 12/137,667, filed Jun. 12, 2008, Titled: AC Illumination Apparatus with Amplitude Partitioning.

* cited by examiner

Fig. 22 though less preferably may be opaque. Chromaphore may be inorganic or organic, or any other material capable of changing the frequency of light. The optical guide can include mirrors, reflective or refractive elements, or absorptive elements that act as extraction features to distribute the light.

SOLID STATE LIGHT WITH OPTICAL GUIDE AND INTEGRATED THERMAL GUIDE

BACKGROUND

The energy efficiency of lighting has become an important consideration in industrial, consumer, and architectural lighting applications. With the advances in solid state light technology, light emitting diodes (LEDs) have become more energy efficient than fluorescent lights. Further, the marketplace has a large established fixture base for Edison, fluorescent and high intensity discharge lights. These types of applications present a significant technical challenge for LEDs due to their inherent point source nature, and the need to operate the LEDs at relatively low temperatures. Today there are many solutions addressing these issues, including fans, thermal sinks, heat pipes and the like. However, these approaches limit the applications by adding complexity, cost, efficiency loss, added failure modes, and an undesirable form factor. The need remains to find a solution that can provide optical and efficiency benefits, at attractive manufacturing costs and design.

SUMMARY

A light, consistent with the present invention, includes a light source, an optical guide, and a thermal guide. The optical guide is coupled to the light source for receiving and distributing light from the light source, and the thermal guide is integrated with the optical guide for providing thermal conduction from the light source for cooling the light.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Figure 1:
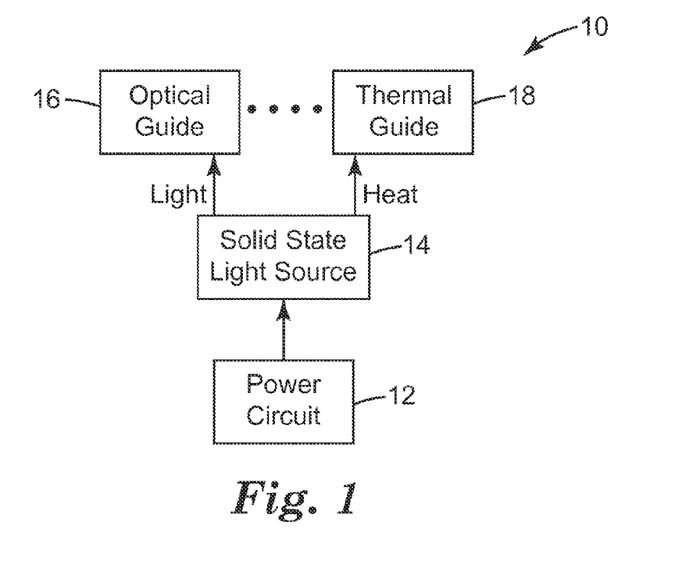
FIG. 1 is a diagram illustrating a solid state light source with an optical guide and integrated thermal guide.

FIG. 1 is a diagram illustrating components of a light 10 having a power circuit 12, a solid state light source 14, and a thermo optical guide comprising an optical guide 16 and an integrated thermal guide 18. Power circuit 12 receives power from a power supply and provides the required voltage and current to drive solid state light source 14, which is optically coupled to optical guide 16. In particular, solid state light source 14 injects light into optical guide 16, which receives and distributes the light. Optical guide 16 includes light injection, light transport, and light extraction zones or elements in order to distribute the light. Thermal guide 18 is integrated with optical guide 16 in order to draw heat from solid state light source 14 through conduction and dissipate the heat through convection to cool light 10 and to efficiently utilize both area and volume for the cooling. Thermal guide 18 includes heat acquisition, heat spreading, and heat dissipation zones or elements in order to cool the light. Through integration of the optical and thermal guides, embodiments of this invention overcome many of the limitations of current solid state light concepts such as those identified above.

Solid state light source 14 can be implemented with, for example, LEDs, organic light emitting diodes (OLEDs), or other solid state light sources. Certain embodiments can provide for uniformly distributed light from the solid state light source. Alternatively, lenses can be used to focus the emitted light. For example, in certain embodiments the light can produce a cone or curtain of light. The lenses could have air permeability for cooling and can include Fresnel lenses, prismatic structures, or lenslet structures. The solid state light sources can emit light of various colors for decorative or other lighting effects. Solid state light source 14 is electrically connected with power circuit 12, which can include a flexible circuit or other circuitry for powering the solid state light source. The circuitry to power the light source can include dimming circuitry and electronics to control frequency shifting or color shifting components that help produce a more desirable light, and an example of such electronics are described in U.S. patent application Ser. No. 12/137,667, entitled "AC Illumination Apparatus with Amplitude Partitioning," and filed Jun. 12, 2008, which is incorporated herein by reference as if fully set forth.

Optical guide 16 can be implemented with, for example, a transparent or translucent material capable of receiving light from the solid state light source and emitting the light. For example, optical guide 16 preferably is made of an optically suitable material such as polycarbonate, polyacrylates such as polymethyl methacrylate, polystyrene, glass, or any number of different plastic materials having relatively high refractive indexes. The optical guide can be configured in a variety of shapes such as a bulb, sphere, cylinder, cube, sheet, or other shape. Furthermore, the optical guide can include a matrix material that can contain light frequency shifting chromaphores to obtain a more desirable color rendering index, and examples of matrix stabilized dyes are described in U.S. Pat. No. 5,387,458, which is incorporated herein by reference as if fully set forth.

Thermal guide 18 can be implemented with a material capable of conducting heat from the solid state light source and dissipating the heat. For example, the thermal guide is preferably comprised of a material with a thermal conductivity from about 1 W/(m–K) to 1000 W/(m–K), and more preferably from 10 W/(m–K) to 1000 W/(m–K), and most preferable from 100 W/(m–K) to 1000 W/(m–K). The thermal guide draws heat from the solid state light source through conduction and dissipates heat into air through convection. Optionally, components of the thermal guide can include heat pipes. The thermal guide is integrated with the optical guide, meaning that the thermal guide is in sufficient contact, directly or indirectly, with the solid state light source in order to conduct and dissipate heat from the solid state light source for the light to function. For example, the thermal guide can draw heat from the solid state light sources to maintain the light sources cool enough to function as intended. The thermal guide can be directly in physical contact with the solid state light sources or indirectly in contact with them such as through a ring or other components upon which the solid state light sources are mounted. The thermal guide can also be in physical contact with the optical guide, either directly or indirectly through other components. Alternatively, the thermal guide need not be in physical contact with the optical guide, provided that the thermal guide can conduct sufficient heat from the solid state light sources in order for the light to function. Therefore, the thermal guide resides either co-extensively proximate at least a portion or preferably a majority of the area of the optical guide, or the thermal guide resides within at least a portion or preferably a majority of the volume of the optical guide in the case of a bulb, sphere or other three dimensional shape having an interior volume.

The thermal guide can include thermal conductive enhancements such as metal coatings or layers, or conductive particles, to help conduct the heat generated by the solid state light sources into and along the thermal guide. Further, the thermal guide can have convective thermal enhancements such as fins and microstructures to increase the convective heat transfer coefficient. The thermal guide can also have optical enhancements in order to enhance the light output of the optical guide. For example, the thermal guide can be formed from a reflective material or a material modified to have a reflective surface such as white paint, a polished surface, or a thin reflective material on its surface.

Figure 2:
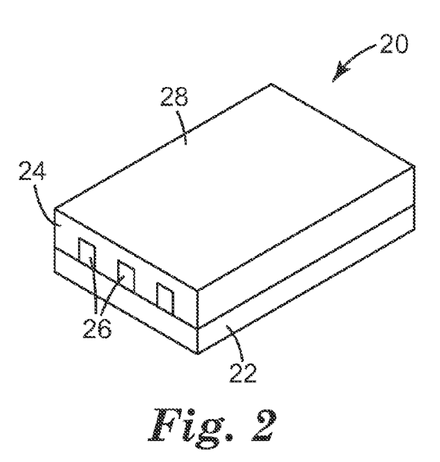
FIG. 2 is a perspective view of a solid state light using an optical guide sheet and co-extensive thermal guide.
Figure 3:
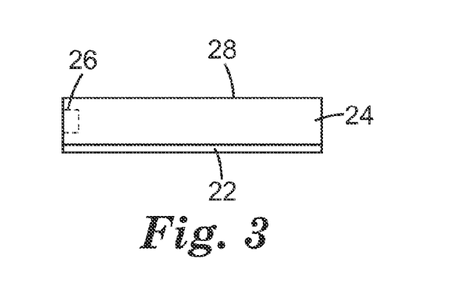
FIG. 3 is a side view of the light of FIG. 2.

FIGS. 2 and 3 are perspective and side views, respectively, of a solid state light 20 using an optical guide sheet 24 and co-extensive thermal guide 22. Light 20 includes a plurality of solid state light sources 26 optically coupled with optical guide sheet 24. For example, solid state light sources 26 can be located within hemispherical or other types of depressions in the edge of optical guide sheet 24 and possibly secured through use of an optically clear adhesive. Optical guide sheet 24 distributes light from the solid state light sources 26 through an emission surface 28, and it can be configured to provide substantially uniform distribution of light across surface 28. Thermal guide 22 is integrated with optical guide 24 by being sufficiently co-extensive and in physical proximity with it in order to draw heat away from solid state light sources 26 and dissipate the heat to maintain light 28 cool enough to function.

Figure 4:
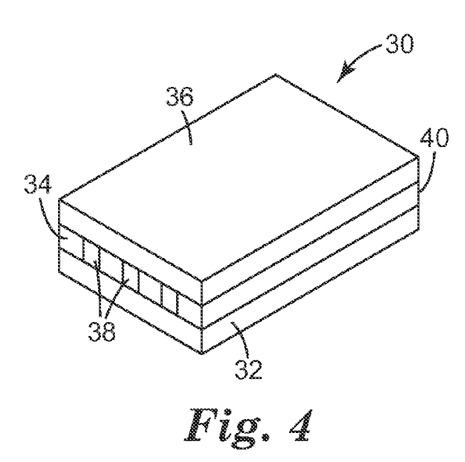
FIG. 4 is a perspective view of a solid state light using an optical guide sheet and dual co-extensive thermal guides.
Figure 5:
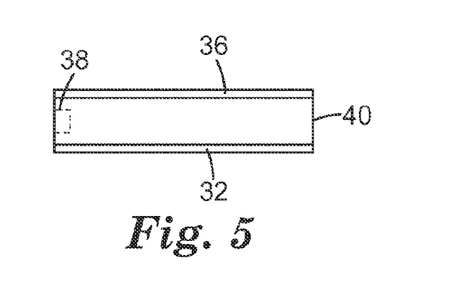
FIG. 5 is a side view of the light of FIG. 4.

FIGS. 4 and 5 are perspective and side views, respectively, of a solid state light 30 using an optical guide sheet 34 and dual co-extensive thermal guides 32 and 36. Light 30 includes a plurality of solid state light sources 38 optically coupled with optical guide sheet 34. For example, solid state light sources 38 can be located within hemispherical or other types of depressions in the edge of optical guide sheet 34 and possibly secured through use of an optically clear adhesive. Optical guide sheet 34 distributes light from the solid state light sources through an emission end 40, and it can be configured to provide substantially uniform distribution of light from end 40. Thermal guides 32 and 36 are integrated with optical guide 34 by being sufficiently co-extensive and in physical proximity with it in order to draw heat away from solid state light sources 38 and dissipate the heat to maintain light 30 cool enough to function.

For lights 20 and 30, the optical guide and co-extensive thermal guide can be configured in a variety of shapes, aside from planar. For example, they can be formed in a circle, spiral, or a non-planar shape for decorative or other lighting effects. The optical guide can be formed from, for example, polycarbonate, polyacrylates such as polymethyl methacrylate, polystyrene, glass, or any number of different plastic materials having relatively high refractive indexes. The co-extensive thermal guides can be formed, for example, as a metallic coating on the optical guide.

Figure 6:
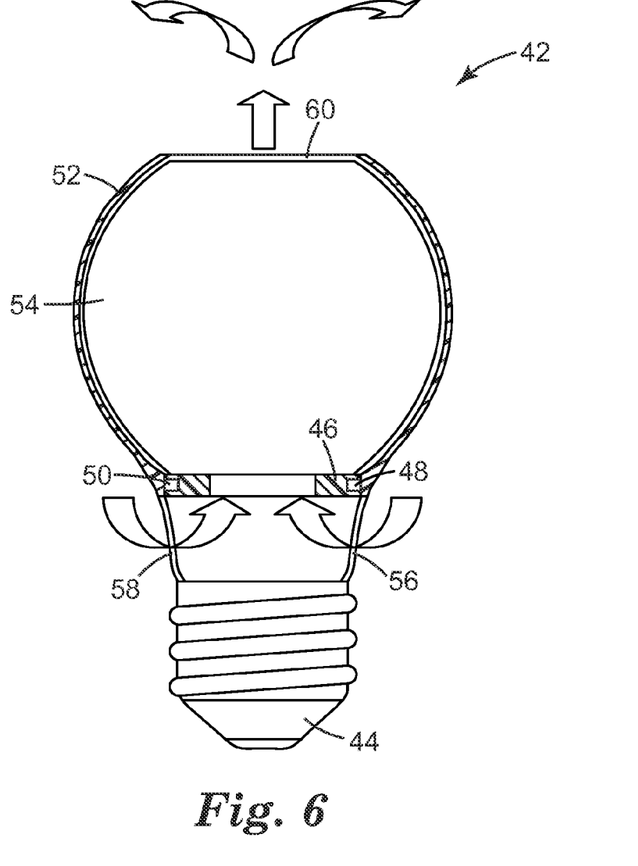
FIG. 6 is a cross sectional side view of a solid state light using an optical guide having an exterior portion for emitting light and an interior portion for cooling.
Figure 7:
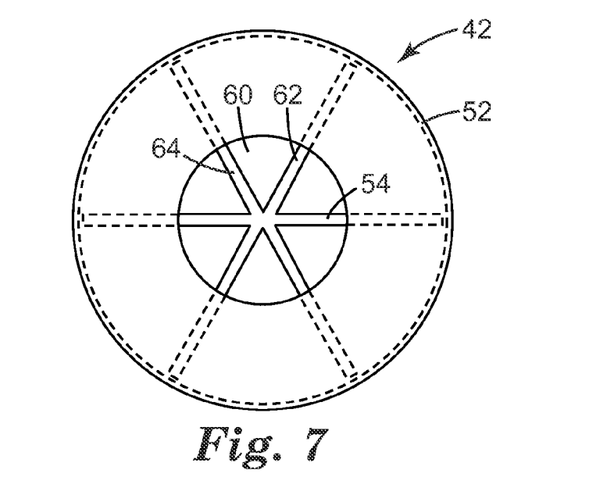
FIG. 7 is a top view of the light of FIG. 6.
Figure 8:
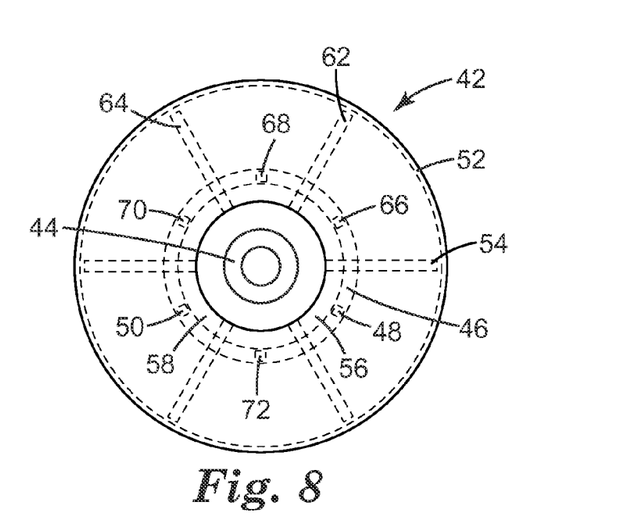
FIG. 8 is a bottom view of the light of FIG. 6.

FIG. 6 is a cross sectional side view of a preferred embodiment of a solid state light 42 using an optical guide having an exterior portion for emitting light and an interior portion for cooling. FIGS. 7 and 8 are top and bottom views, respectively, of light 42. Light 42 includes an optical guide 52, integrated thermal guide 54, and solid state light sources on an optional heat spreader ring 46. The heat spreader ring 46 can operate by thermal conduction or have a heat pipe or thermal siphon associated with it. The heat spreader ring contains elements that efficiently connect to the thermal guide, an example of which includes a ring containing bent fin elements that are thermally connected to the thermal guide. Alternatively, the solid state light sources can be coupled directly to a thermal guide without a heat spreader ring. For the solid state light sources, light 42 can include, for example, LEDs 48, 50, 66, 68, 70, and 72 arranged around ring 46, as shown in FIG. 8. The solid state light sources are optically coupled to optical guide 52; for example, the light sources can be located within hemispherical or other types of depressions in an edge of optical guide 52 and possibly secured through use of an optically clear adhesive.

A base 44 is configured to connect to a power supply, and it can include a power circuit for providing the required voltage and current from the power supply to drive the solid state light sources. Base 44 can be implemented with, for example, an Edison base for use with conventional light bulb sockets or a base for use with conventional fluorescent light fixture connections. Air passages 56 and 58 are provided between optical guide 52 and base 44 to provide free convection across thermal guide 54 through an air passage 60.

In this exemplary embodiment, the thermal guide is implemented with metallic fins 54, 62, and 64, as illustrated in FIG. 7. The fins are integrated with light guide 52, as shown in FIGS. 7 and 8, in order to draw heat from solid state light sources 48, 50, 66, 68, 70, 72 and dissipate the heat through convection by air flow in air passage 60. The thermal guide can optionally include a heat pipe or thermal siphon. Optical guide 52 can be implemented with, for example, polycarbonate, polyacrylates such as polymethyl methacrylate, polystyrene, glass, or any number of different plastic materials having relatively high refractive indexes. The exterior portion of light 42 can be used to distribute and emit light from the solid state light sources, and the interior portion of light 42 is used for cooling the thermal guide and solid state light sources. Optical guide 52 can be formed in a bulb shape, as represented in FIG. 6, or in other shapes. With certain shapes, such as a bulb shape shown in FIG. 6, the interior portion of optical guide 52 can form an interior volume, and the thermal guide can be integrated with the interior volume of the optical guide for providing thermal conduction from the solid state light sources.

Figure 9:
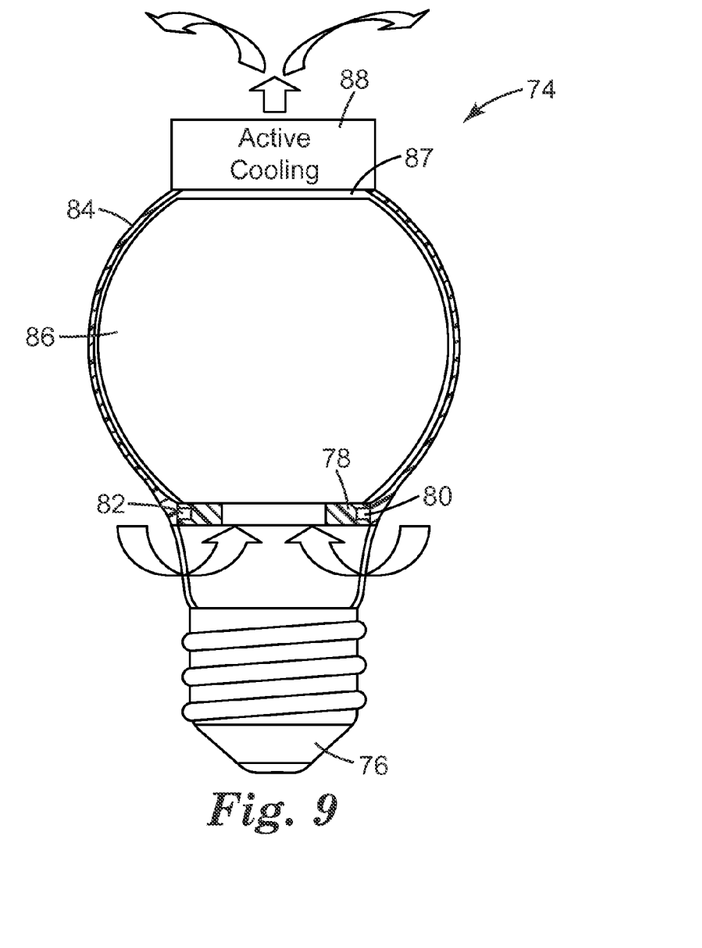
FIG. 9 is a cross sectional side view of a solid state light with an active cooling element.

FIG. 9 is a cross sectional side view of a solid state light 74 with an active cooling element 88. Light 74 can have a similar construction as light 42. Light 74 includes a base 76, an optical guide 84, a thermal guide 86, and solid state light sources, such as LEDs 80 and 82, arranged on an optional heat spreader ring 78. Active cooling element 88, such as a fan, draws air through air passage 87 for cooling in addition to free convection. Active cooling element 88 can be coupled to a power source through base 76, and it can run continuously when light 74 is in operation or can include a temperature sensor to active it only when light 74 is above a certain temperature.

Figure 10:
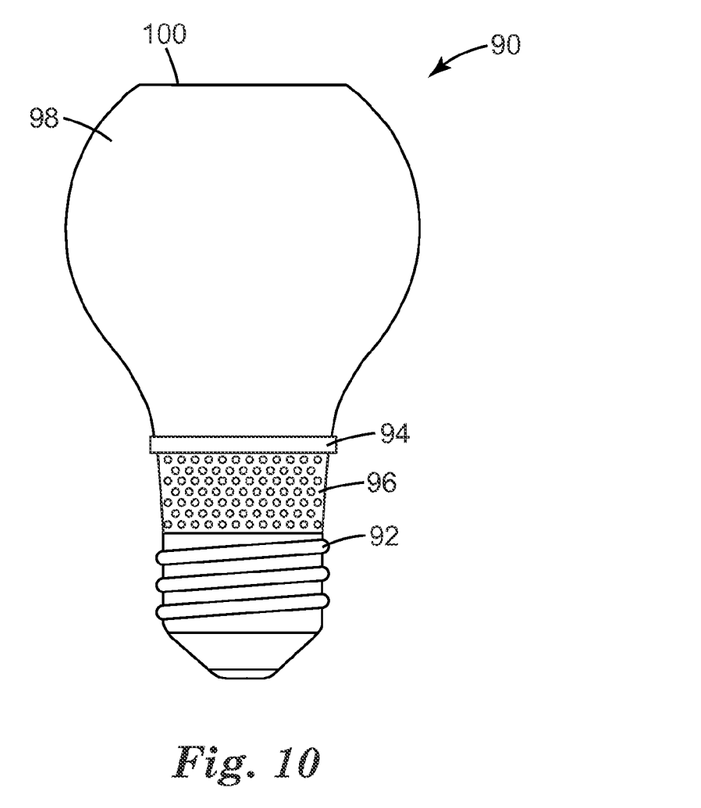
FIG. 10 is a side view of a solid state light with a thermal guide having an air passage.
Figure 11:
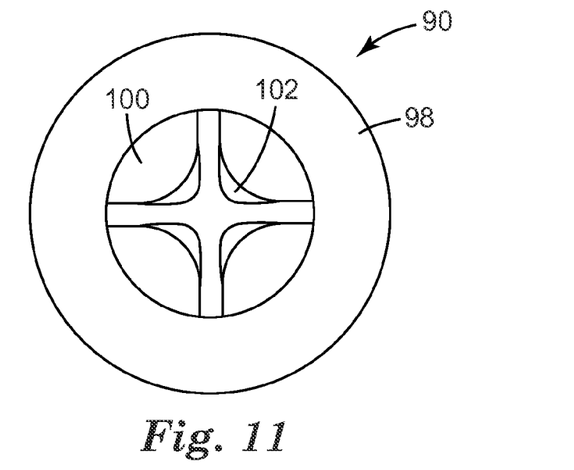
FIG. 11 is a top view of the light of FIG. 10.

FIGS. 10-15 illustrate additional configurations of solid state lights having an optical guide with an exterior portion for emitting light and an interior portion for cooling via an integrated thermal guide. They can function in a manner similar to light 42 as described above. FIGS. 10 and 11 are side and top views, respectively, of a solid state light 90 with a perforated air passage opening. Light 90 includes a base 92 for connection to a power supply, an optical guide 98 for distributing light, an air passage 100 through optical guide 98, and a thermal guide associated with optical guide 98. The thermal guide includes fins 102, a ring 94, and a perforated portion 96 between base 92 and ring 94. Perforated portion 96 allows for air flow through air passage 100. Fins 102 of the thermal guide conduct heat from ring 94 and dissipate the heat through convection in air passage 100.

Figure 12:
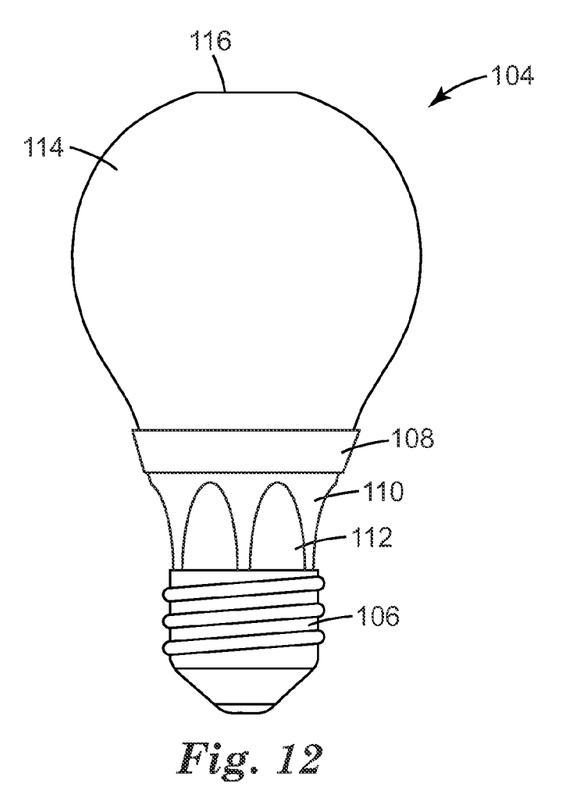
FIG. 12 is a side view of a solid state light with a thermal guide having an air passage.
Figure 13:
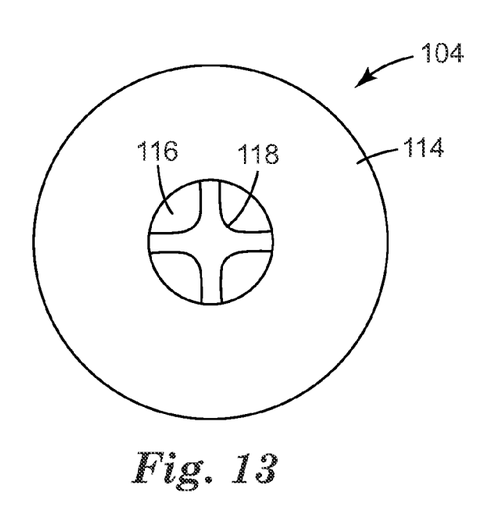
FIG. 13 is a top view of the light of FIG. 12.

FIGS. 12 and 13 are side and top views, respectively, of a solid state light 104 with a thermal guide having plurality of apertures. Light 104 includes a base 106 for connection to a power supply, an optical guide 114 for distributing light, an air passage 116 through optical guide 114, and a thermal guide associated with optical guide 114. The thermal guide includes fins 118, a ring 108, and a section 110 having a plurality of apertures 112 between base 106 and ring 108. Apertures 112 allow for air flow through air passage 116. Fins 118 of the thermal guide conduct heat from ring 108 and dissipate the heat through convection in air passage 116.

Figure 14:
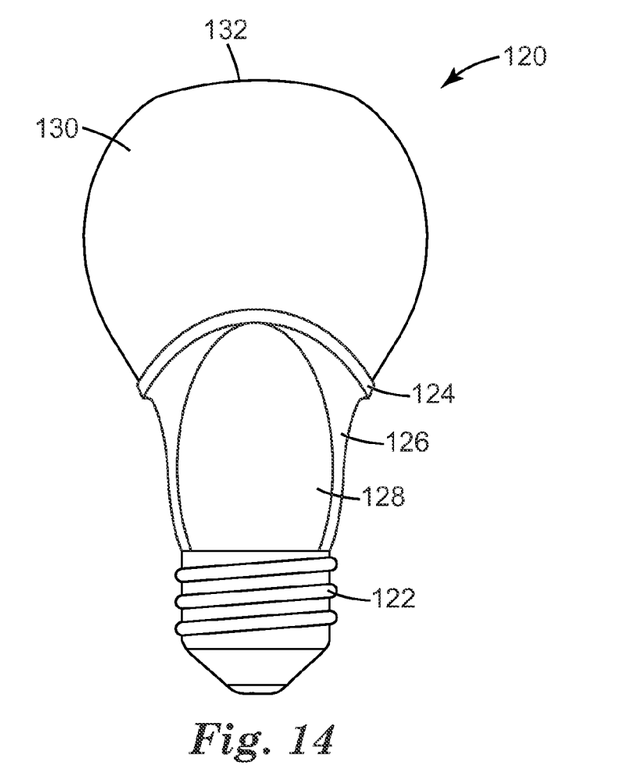
FIG. 14 is a side view of a solid state light with a thermal guide having a single aperture.
Figure 15:
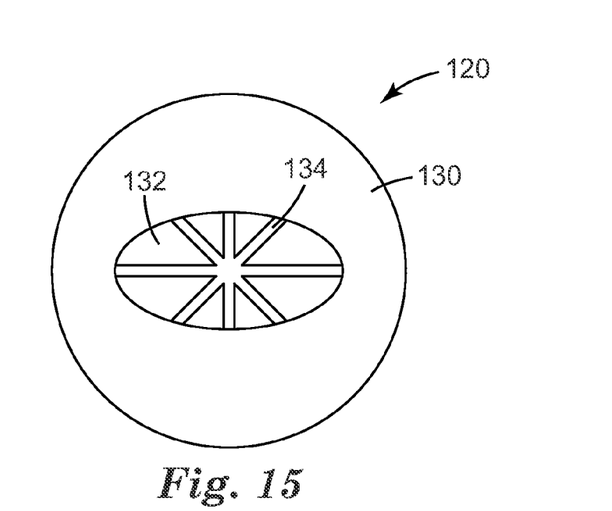
FIG. 15 is a top view of the light of FIG. 14.

FIGS. 14 and 15 are side and top views, respectively, of a solid state light 120 with a thermal guide having a single aperture. Light 120 includes a base 122 for connection to a power supply, an optical guide 130 for distributing light, an air passage 132 through optical guide 130, and a thermal guide associated with optical guide 130. The thermal guide includes fins 134, a ring 124, and a section 126 having an aperture 128 between base 122 and ring 124. Aperture 128 allows for air flow through air passage 132. Fins 134 of the thermal guide conduct heat from ring 124 and dissipate the heat through convection in air passage 132.

Figure 16:
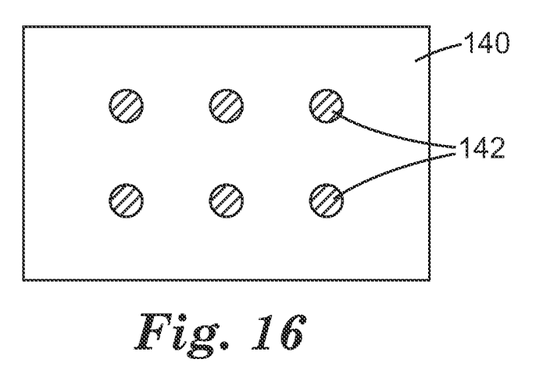
FIG. 16 is a diagram illustrating an optical guide with light extraction features.
Figure 17:
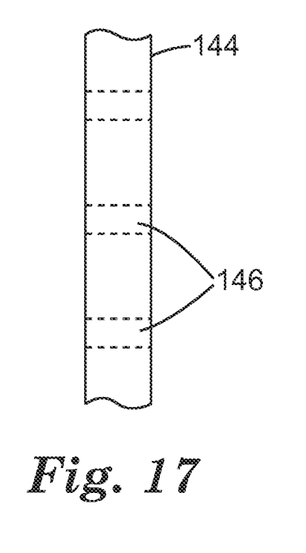
FIG. 17 is a diagram illustrating an optical guide with apertures for cooling or as extraction features.
Figure 18:
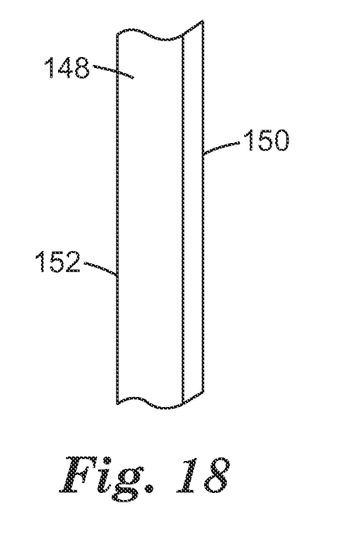
FIG. 18 is a diagram illustrating an optical guide with a reflective layer.

FIGS. 16-18 illustrate various optional features for an optical guide for the solid state lights described above. FIG. 16 is a diagram illustrating an optical guide 140 with light extraction features 142. Such light extraction features can be used to provide for greater or more uniform distribution of light emitted by the optical guide, or the extraction features can provide for particular optical effects such as tailoring the light pattern for particular illumination patterns. Examples of extraction features include a pattern of dots or other shapes of light extraction material printed or otherwise affixed onto the exterior or interior surface of the optical guide. Extraction features can also include roughening of the exterior of the optical guide through sandblasting or other techniques, and other extraction features include microstructured features formed on a surface such as microstructured prisms or lenslets.

FIG. 17 is a diagram illustrating an optical guide 144 with apertures 146 for cooling. If the solid state light is mounted substantially horizontally, apertures 146 can provide for air flow through the optical guide and across the thermal guide for the cooling though convection rather than air flow substantially along the interior surface of the optical guide such as through air passage 60. Apertures 146 can also function as extraction features.

FIG. 18 is a diagram illustrating an optical guide 148 with a reflective layer 150. Optical guide 148 can include reflective layer 150 on its interior surface such that a portion of light distributed through optical guide 148 is reflected by reflective layer 150 and emitted from exterior surface 152 rather than being emitted from the interior surface of the optical guide. An example of a reflective layer is the Enhanced Specular Reflective (ESR) film product available from 3M Company.

Figure 19:
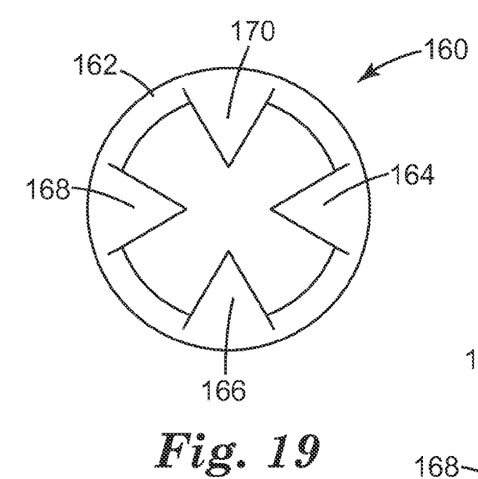
FIG. 19 is a top view of a heat spreader prior to forming features that couple to fins for the thermal guide.
Figure 20:
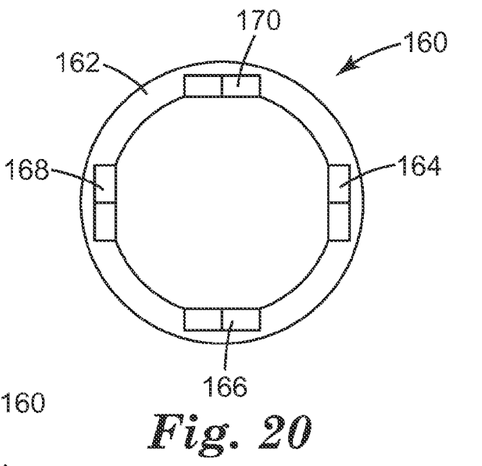
FIG. 20 is a top view of the heat spreader of FIG. 19 after forming the features.
Figure 21:
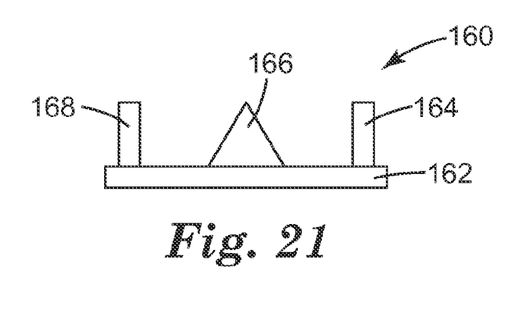
FIG. 21 is a side view of the heat spreader of FIG. 19 after forming the features.
Figure 22:
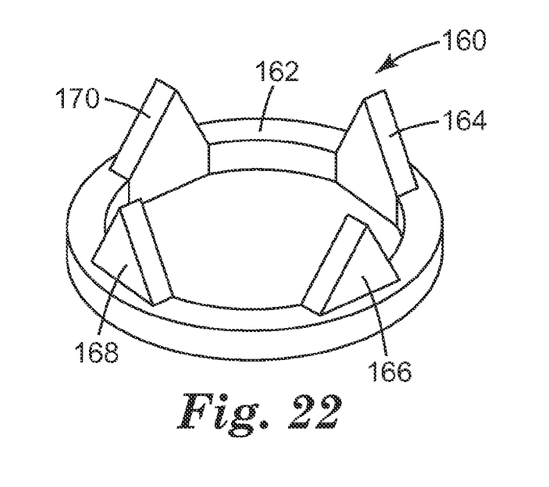
FIG. 22 is a top view of the heat spreader of FIG. 19 after forming the features.

FIGS. 19-22 illustrate a heat spreader 160 with features for use in mounting fins of a thermal guide. FIG. 19 is a top view of heat spreader 160 prior to forming the features that couple to fins for the thermal guide. FIGS. 20, 21, and 22 are top, side, and perspective view, respectively, of heat spreader 160 after forming the features. Heat spreader 160 can operate in a manner similar to heat spreader ring 46 as described above but with the additional features for mounting cooling fins for connection with the thermal guide.

As shown in FIG. 19, heat spreader 160 has a ring portion 162 and triangularly shaped sections 164, 166, 168, and 170. In a manufacturing process, heat spreader 160 can be formed from a sheet of metal or other material. For example, a stamping process can be used to cut heat spreader 160 from the sheet of metal and bend sections 164, 166, 168, and 170 to substantially right angles to ring portion 162, as shown in FIGS. 20-22, forming upward protrusions.

The solid state light sources can be mounted on ring portion 162 in a manner similar to the LEDs mounted on heat spreader ring 46. Cooling fins of a thermal guide, such as the fins described above, can be thermally connected to sections 164, 166, 168, and 170 such as through soldering, conductive epoxy, clips, or in other ways. In that manner, heat spreader 160 with the mounting features effectively becomes part of the thermal guide and can be easily manufactured from a sheet of material. Four triangularly shaped sections 164, 166, 168, and 170 are shown for illustrative purposes only. More or fewer features can be used, and the features can have various shapes, depending upon, for example, a configuration of the cooling fins to which they are to be connected.

The invention claimed is:

1. A light with integrated light and thermal guides, comprising:
   a light source;
   a light guide coupled to the light source for receiving and distributing light from the light source, wherein the light is transported within the light guide until the light exits from a surface of the light guide; and
   a thermal guide integrated with the light guide for providing thermal conduction from the light source for cooling the light, wherein the thermal guide comprises a solid material capable of conducting heat from the light source and dissipating the heat,
   wherein the light guide comprises a material having a first surface and a second surface opposite the first surface and an edge between the first and second surfaces, the light exits from the first or second surface, and the light with the integrated light and thermal guides provides for air flow proximate the first and second surfaces,
wherein the light source is located at the edge of the light guide in order to optically couple the light into the light guide at the edge.

2. The light of claim 1, wherein the light source comprises one or more of the following: a light emitting diode; and an organic light emitting diode.

3. The light of claim 1, further comprising a heat spreader coupled to the light source.

4. The light of claim 1, wherein the light guide includes light extraction features.

5. The light of claim 1, further comprising a reflective layer on one side of the light guide.

6. The light of claim 1, wherein the light guide comprises a sheet of material and the thermal guide comprises a thermally conductive material co-extensive with the light guide.

7. The light of claim 1, further comprising a circuit for providing power to the light source.

8. The light of claim 1, wherein the light source is contained within a depression in the edge of the light guide.

9. A light with integrated light and thermal guides, comprising:
a light source;
a light guide comprising a material having a first surface and a second surface opposite the first surface and an edge between the first and second surfaces, wherein the light guide is coupled to the light source for receiving and distributing light from the light source, wherein the light is transported within the light guide until the light exits from the first or second surface of the light guide, wherein the light source is located at the edge of the light guide in order to optically couple the light into the light guide at the edge; and
a thermal guide integrated with the light guide for providing thermal conduction from the light source for cooling the light,
wherein the light guide includes a plurality of apertures.

10. A light with integrated light and thermal guides, comprising:
a light source;
a light guide comprising a material having a first surface and a second surface opposite the first surface and an edge between the first and second surfaces, wherein the light guide is coupled to the light source for receiving and distributing light from the light source, wherein the light is transported within the light guide until the light exits from the first or second surface of the light guide, wherein the light source is located at the edge of the light guide in order to optically couple the light into the light guide at the edge; and
a thermal guide integrated with the light guide for providing thermal conduction from the light source for cooling the light,
wherein the thermal guide comprises a surface reflective in a visible light range.

11. A light with integrated light and thermal guides, comprising:
a light source;
a light guide comprising a material having a first surface and a second surface opposite the first surface and an edge between the first and second surfaces, wherein the second surface forms an interior volume, the light guide is coupled to the light source for receiving and distributing light from the light source through the first or second surface, and the light is transported within the light guide until the light exits from the first or second surface of the light guide, wherein the light source is located at the edge of the light guide in order to optically couple the light into the light guide at the edge; and
a thermal guide at least partially contained within the interior volume and integrated with the light guide for providing thermal conduction from the light source for cooling the light, wherein the thermal guide comprises a solid material capable of conducting heat from the light source and dissipating the heat.

12. The light of claim 11, wherein the light source comprises one or more of the following: a light emitting diode; and an organic light emitting diode.

13. The light of claim 11, further comprising a heat spreader coupled to the light source.

14. The light of claim 11, wherein the first surface of the light guide includes light extraction features.

15. The light of claim 11, wherein the light guide comprises a bulb shape.

16. The light of claim 11, further comprising a base for connection to a power supply, and wherein the thermal guide includes a perforated portion between the base and the light guide.

17. The light of claim 11, further comprising a base for connection to a power supply, and wherein the thermal guide includes one or more apertures between the base and the light guide.

18. The light of claim 11, wherein the thermal guide comprises a heat spreader and fins, and wherein the heat spreader has features that couple to the fins.

19. The light of claim 11, further comprising a circuit for providing power to the light source.

20. The light of claim 11, wherein the light source is contained within a depression in the edge of the light guide.

21. A light with integrated light and thermal guides, comprising:
a light source;
a light guide comprising a material having a first surface and a second surface opposite the first surface, wherein the second surface forms an interior volume, the light guide is coupled to the light source for receiving and distributing light from the light source through the first or second surface, and the light is transported through the light guide until the light exits from the first or second surface of the light guide;
a thermal guide at least partially contained within the interior volume and integrated with the light guide for providing thermal conduction from the light source for cooling the light; and
a fan for drawing air across the thermal guide.

22. A light with integrated light and thermal guides, comprising:
a light source;
a light guide comprising a material having a first surface and a second surface opposite the first surface and an edge between the first and second surfaces, wherein the second surface forms an interior volume, the light guide is coupled to the light source for receiving and distributing light from the light source through the first or second surface, and the light is transported within the light guide until the light exits from the first or second surface of the light guide, wherein the light source is located at the edge of the light guide in order to optically couple the light into the light guide at the edge; and
a thermal guide at least partially contained within the interior volume and integrated with the light guide for providing thermal conduction from the light source for cooling the light,
wherein the thermal guide comprises metal fins.

23. A light with integrated light and thermal guides, comprising:
a light source;
a light guide comprising a material having a first surface and a second surface opposite the first surface and an edge between the first and second surfaces, wherein the second surface forms an interior volume, the light guide is coupled to the light source for receiving and distributing light from the light source through the first or second surface, and the light is transported within the light guide until the light exits from the first or second surface of the light guide, wherein the light source is located at the edge of the light guide in order to optically couple the light into the light guide at the edge; and a thermal guide at least partially contained within the interior volume and integrated with the light guide for providing thermal conduction from the light source for cooling the light, wherein the light guide includes a plurality of apertures.

24. A light with integrated light and thermal guides, comprising:

a light source;

a light guide comprising a material having a first surface and a second surface opposite the first surface, wherein the second surface forms an interior volume, the light guide is coupled to the light source for receiving and distributing light from the light source through the first or second surface, and the light is transported through the light guide until the light exits from the first or second surface of the light guide;

a thermal guide at least partially contained within the interior volume and integrated with the light guide for providing thermal conduction from the light source for cooling the light, wherein the thermal guide comprises a solid material capable of conducting heat from the light source and dissipating the heat; and a reflective layer on the second surface of the light guide.

25. A light with integrated light and thermal guides, comprising:

a light source;

a light guide comprising a material having a first surface and a second surface opposite the first surface and an edge between the first and second surfaces, wherein the second surface forms an interior volume, the light guide is coupled to the light source for receiving and distributing light from the light source through the first or second surface, and the light is transported within the light guide until the light exits from the first or second surface of the light guide, wherein the light source is located at the edge of the light guide in order to optically couple the light into the light guide at the edge; and a thermal guide at least partially contained within the interior volume and integrated with the light guide for providing thermal conduction from the light source for cooling the light, wherein the thermal guide comprises a material reflective in a visible light range.

26. A light with integrated light and thermal guides, comprising:

a base configured for connection to a power source;

a section having a first side coupled to the base, a second side opposite the first side, and at least one aperture between the first and second sides;

a plurality of light emitting diodes (LEDs) located adjacent the second side of the section;

a light guide having a first end coupled to the second side of the section and having a second end opposite the first end and forming an aperture, wherein the light guide comprises a material having a first surface and a second surface opposite the first surface and an edge between the first and second surfaces, the second surface forms an interior volume, the light guide is coupled to the LEDs for receiving and distributing light from the LEDs through the first or second surface, and the light is transported within the light guide until the light exits from the first or second surface of the light guide, wherein the LEDs are located at the edge of the light guide in order to optically couple the light into the light guide at the edge; and a thermal guide at least partially contained within the interior volume and integrated with the light guide for providing thermal conduction from the light source for cooling the light, wherein the thermal guide comprises a solid material capable of conducting heat from the LEDs and dissipating the heat.

27. The light of claim 26, further comprising extraction features on the first surface of the light guide.

28. The light of claim 26, wherein a shape of the thermal guide conforms to a shape of the interior volume.

* * * * *